(12) United States Patent
Franca-Neto

(10) Patent No.: US 6,507,915 B1
(45) Date of Patent: Jan. 14, 2003

(54) CLOCK AND DATA SIGNAL SEPARATOR CIRCUIT

(75) Inventor: Luiz M. Franca-Neto, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/474,530

(22) Filed: Dec. 29, 1999

(51) Int. Cl.[7] .................................................. G06F 1/04
(52) U.S. Cl. ....................................................... 713/401
(58) Field of Search ................................ 713/400, 401, 713/600

(56) References Cited

U.S. PATENT DOCUMENTS

| | | | | |
|---|---|---|---|---|
| 5,412,697 A | * | 5/1995 | Van Brunt et al. | 375/360 |
| 5,590,364 A | * | 12/1996 | Hanzawa et al. | 712/43 |
| 5,619,541 A | * | 4/1997 | Van Brunt et al. | 375/360 |
| 6,008,734 A | * | 12/1999 | Lowe | 340/825.2 |

* cited by examiner

Primary Examiner—Thomas M. Heckler
(74) Attorney, Agent, or Firm—Schwegman, Lundberg, Woessner & Kluth, P.A.

(57) ABSTRACT

A clock and data separator circuit and method that separates data and clock signals that may coincide. The separator circuits use CMOS transistors to extend the time separation between transitions in the data signals and transitions in clock signals. The processing circuitry comprises pass gates that are selectively controlled to delay the latter of the input signals received at substantially the same time. In one embodiment the processing circuitry, or separator circuit, comprises a signal separator circuit that has two controllable current paths. In such an embodiment, whichever signal arrives first in time will delay the transition of the second arriving signal. In another embodiment, the processing circuitry comprises pass transistors that control a propagation path of a first input signal. The pass transistors are controlled by a second input signal. Likewise, whichever signal arrives first in time will delay the transition of the second arriving signal.

22 Claims, 5 Drawing Sheets

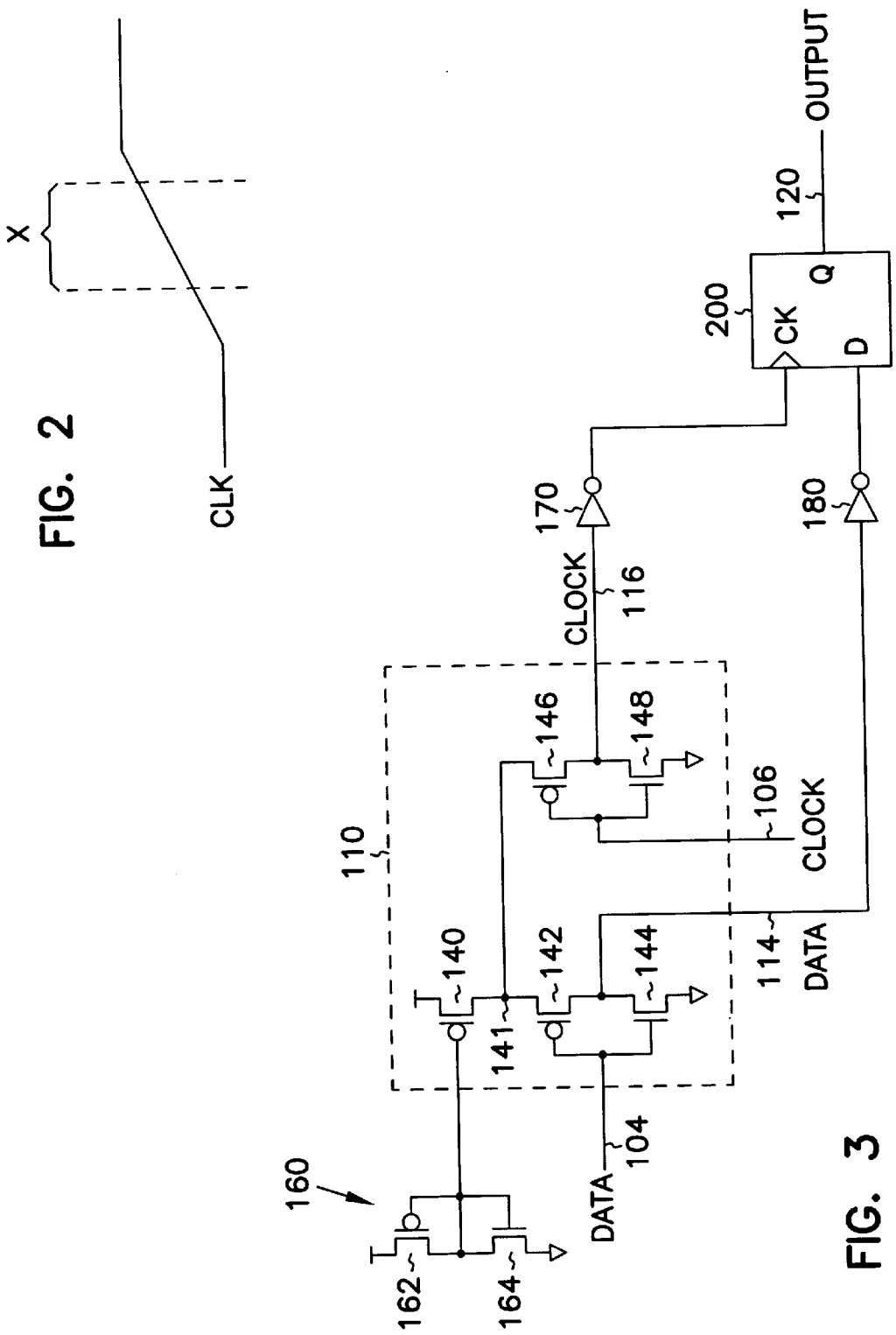

CLOCK AND DATA SIGNAL SEPARATOR CIRCUIT

TECHNICAL FIELD OF THE INVENTION

The present invention relates generally to signal processing circuitry and in particular the present invention relates to clock signals and data signals separator circuits.

BACKGROUND OF THE INVENTION

In an integrated circuit environment, it is possible to have two subsystems on one chip that communicate with each other or one subsystem on one chip and a second subsystem on another chip which communicates with each other. This environment may include communication errors when a local clock of a local system samples incoming data signals from a remote subsystem. That is, synchronization between clock and data signals may not always be maintained. For communications to remain error-free, the local system needs to maintain synchronization with the remote system. In other words, it is imperative that the sender and receiver sample the data signal in sync.

Near-perfect synchronization could be accomplished if both the sender and the receiver used the same clock. However, this isn't practical because of the many different systems and many interfaces that are necessary. Hence, for practical reasons the local receiver is periodically synchronized with the remote transmitter. The clocks of each system maintain sampling integrity between synchronization pulses. A common technique is to synchronize source signals, e.g., a clock signal and a data signal.

Less than perfect synchronization that results in data errors, is in general referred to as data meta-stability. This is because various data signals can arrive at any time and their edges/transitions that represent the occurrence of some event can also arrive at unpredictable moments in time. This phenomenon typically occurs when converting from asynchronous to synchronous communication. The terms "asynchronous" and "synchronous" are well known in the art. However, some designers also refer to the process of retrieving data after sampling an unknown edge, with respect to the local system receiving the data under the local clock, as asynchronous.

Special circuitry, otherwise known as a signal separator circuit, determine when data signal edges and clock pulse edges occur nearly simultaneously and when they do not. In other words, the signal separator circuit performs a signal processing operation when the two signals coincide. The separation of the signals (clock and data) is desired when a device such as a flip-flop has to re-sample the data and correctly interpret it. A flip-flop, or similar circuitry, has to have enough time to resolve the correct value of the data. In the past, inductors/transformers were used as part of the data meta-stability solvers.

The electronic industry has grown tremendously because of the ability of chip designers and chip manufacturers to constantly shrink the chip while increasing the number of components on the chip, while decreasing cost. Because integrated circuit real estate is expensive, bulky inductors are not desired. For example, a designer utilizing inductor technology may need to reserve approximately a 200×200 micron area of chip real estate specifically for the inductor.

For the reasons stated above, and for other reasons stated below which will become apparent to those skilled in the art upon reading and understanding the present specification, there is a need in the art for economical circuitry that separates data signal edges and clock pulse edges.

SUMMARY OF THE INVENTION

The above mentioned problems and other problems are addressed by the present invention and will be understood by reading and studying the following specification.

In one embodiment, a signal processing circuit comprises a data input node to receive a data input signal, and a clock input signal node to receive a clock input signal. In addition, a signal separator circuit is coupled to the data input node and the clock input node such that transitions in the data input signal and transitions in the clock input signal have a first time differential. The signal separator circuit itself comprises a data output node and a clock output node. Within the signal separator circuit pass gate transistors can be selectively activated to provide an output data signal on the data output node and an output clock signal on the clock output node wherein transitions in the output data signal and transitions in the output clock signal have a second time differential that is greater than the first time differential. Subsequently, a latch circuit is coupled to the signal separator circuit for receiving the output clock signal and the output data signal.

In another embodiment, a signal processing circuit comprises receiving a data input signal at a data input node, and receiving a clock input signal at a clock input signal node. A signal separator circuit is coupled to the data input node and the clock input node. The signal separator circuit comprises a first P-channel transistor coupled in series with a first N-channel transistor, wherein the gate connections of the first P-channel transistor and the first N-channel transistor are coupled to the data input node. The signal separator circuit also comprises a second P-channel transistor coupled in series with a second N-channel transistor, wherein the gate connections of the second P-channel transistor and the second N-channel transistor are coupled to the clock input node. A third P-channel transistor is coupled to the first and second P-channel transistors. Moreover, the circuit includes a flip-flop circuit and two inverter circuits. The first inverter circuit is coupled between a data output node of the signal separator circuit and the flip-flop circuit. The second inverter circuit is coupled between a clock output node of the signal separator circuit and the flip-flop circuit.

In yet another embodiment, in a method a clock input signal that undergoes a clock transition and a data input signal that undergoes a data transition are received at a signal separator. Upon analyzing the synchronization of the data transition with the clock transition, a person skilled in the art can increase the delay between the clock transition and the data transition, by implementing CMOS circuitry to form pass gate circuitry, provided that the clock transition is substantially synchronized with the data transition.

BRIEF DESCRIPTION OF THE DRAWINGS

FIG. 2 is a schematic diagram of another embodiment of the present invention detailing a signal separator circuit of another embodiment of the present invention;

FIG. 3 is a schematic diagram of another embodiment of the present invention;

DETAILED DESCRIPTION OF THE INVENTION

In the following detailed description of the embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

The invention described herein is useful in many integrated circuits or other similar devices, where data signals arrive from a remote location at unspecified times and need to be synchronized with a local clock signal. The circuitry described below is constructed with transistor circuitry that augments a delay between two input signals that arrive nearly at the same moment in time. These input signals may or may not be thought of as competing signals. In one embodiment, CMOS transistors are used in a circuit that reacts well to signal transitions. The transition of the signals are commonly referred to as "edges." The circuit topology that provides the desired time separation of the clock and data signals is explained in more detail below.

Figure 1:
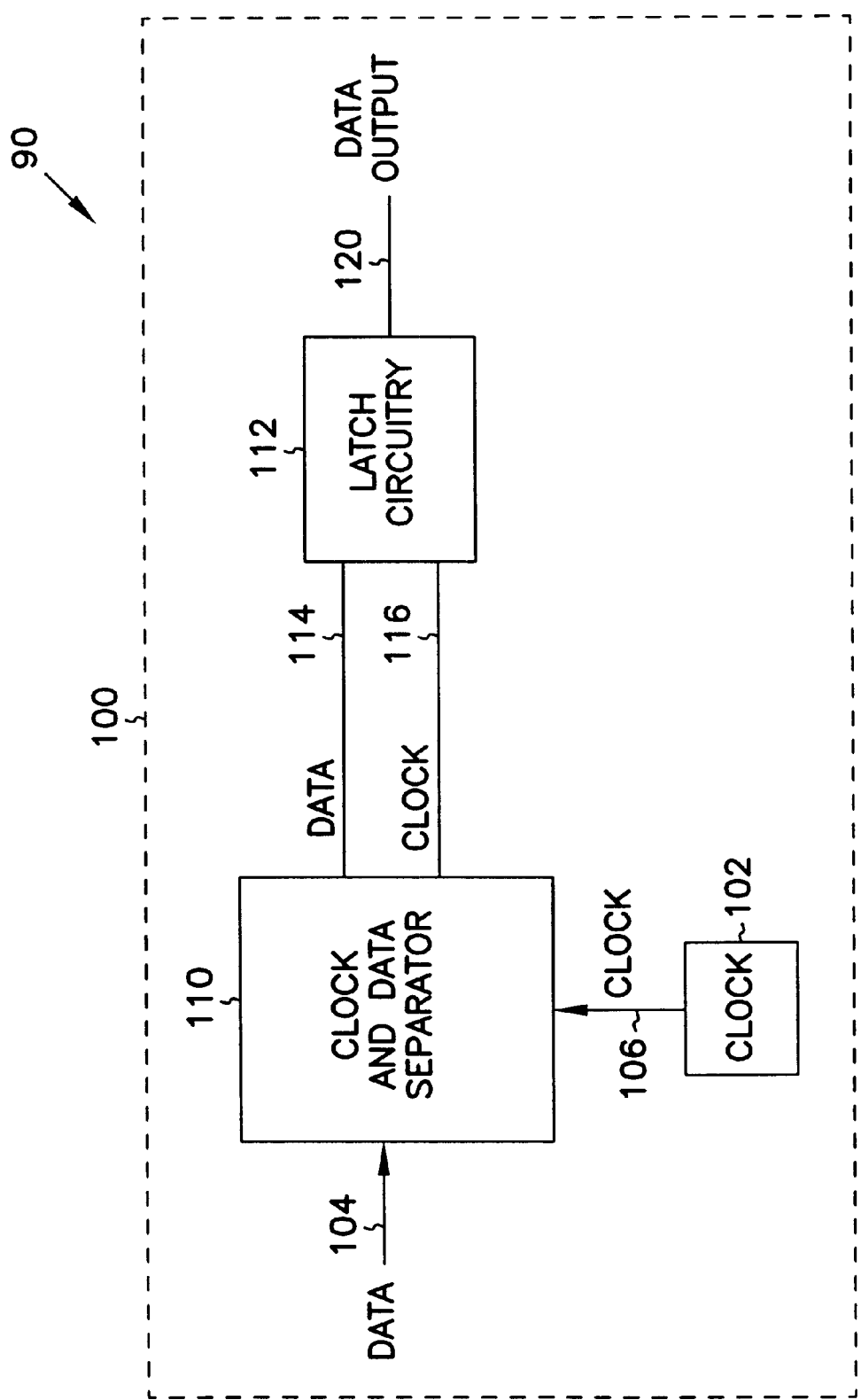
FIG. 1 is a block diagram of a signal separator circuit according to one embodiment of the present invention.

Referring to FIG. 1, a simplified block diagram is provided to illustrate a clock in data processing system 100 according to one embodiment of the present invention provided in an integrated circuit 90. The system receives a remotely generated data input signal provided on data connection 104. A local clock circuit 102 is used to provide a clock signal on clock connection 106. The local clock circuit can be provided on an integrated circuit containing clock and data separator circuit 110. As such, the local clock is distinguished from an input connection provided on an integrated circuit for receiving the clock signal generated at a remote location. The clock and data separator circuit 110 receives the data and clock signals and provides the separation between the signals if the signals arrive at substantially the same time. Circuit 110 provides two output nodes, a data output node 114 and a clock output node 116. Latch circuitry 112 is provided to receive the signals from the clock in data separator circuit and latch an appropriate data signal in response to the clock signal. The latch signal, therefore, provides an output on connection 120 representing the appropriate data signal.

It will be appreciated by those skilled in the art, that receiving a clock and data signal that are transitioning states at substantially the same time can result in errors. For example, referring to FIG. 2, a clock signal is illustrated that is transitioning from a low state to a high state. The clock signal is used to activate a latch circuit, such as a flip-flop latch. If a transition is experienced in a data signal connected to the latch circuit during the transition period of the clock signal (as indicated by region X), the latch circuit may not be able to accurately determine a state of the data signal. Further, the evaluation time required by the flip-flop to latch a state of the data signal may be increased.

One embodiment of the clock and data separator circuit 110 of the present invention provides a time separation between the clock and data signals if the clock and data signals are transitioning states at substantially the same moment in time. Referring to FIG. 3, a schematic diagram of one embodiment of the present invention is illustrated. The separator circuit uses all CMOS transistors to provide competing current paths. The separator circuit includes a P-channel transistor 140 coupled in series with P-channel transistor 142 and n-channel transistor 144. Transistor 144 has a drain connected to node 114 and a source connected to a ground node. Gate connections of transistor 142 and transistor 144 are coupled to receive the data signal provided on connection 104. The intermediate node 114 between transistors 142 and 144 provide the output data signal from the separator circuit. P-channel transistor 146 and n-channel transistor 148 are also connected in series with transistor 140. Transistor 148 has a drain connected to node 116 and a source connected to the ground node. The gate connections of transistors 146 and 148 are connected together to receive a clock signal provided on connection 106. Intermediate node 116 between transistors 146 and 148 provides an output clock signal from the separator circuit. Node 114 is connected to inverter circuit 180 which provides the processed data signal to flip-flop circuit 200. Similarly, node 116 is coupled to inverter circuit 170 which provides a processed clock signal to the flip-flop circuit.

A bias circuit 160 is coupled to the gate connection of transistor 140. In one embodiment the bias circuit comprises series connected P-channel transistor 162 and n-channel transistor 164. The bias circuit 160 and transistor 140 can act as a current source for node 141. Two possible current paths are provided in the separator circuit. The first current path is through transistors 140, 142 and 144. The second current path is through transistors 140, 146 and 148. In operation, if the data signal and the clock signal arrive at nodes 104 and 106, respectively, with a sufficient time separation, the two current paths do not compete. That is, assuming that data signal on input 104 transitions from a low state to a high state, transistor 144 is activated and transistor 142 is deactivated. As such, node 114 is coupled to ground through transistor 144. It will be appreciated by those skilled in the art, that during the transition of the data signal both transistor 142 and transistor 144 are simultaneously partially activated. If the clock signal transition is received after transistor 142 has been turned off, transistors 146 and 148 respond to the clock signal. That is, if the clock signal transitions from a low state to a high state, transistor 146 is turned off and transistor 148 is turned on. Again, both transistors 146 and 148 will be slightly turned on simultaneously during the transition of the clock signal.

During the above example, the separator circuit responds to the data and clock signals without providing extra separation between the clock and delay output signals provided on nodes 116 and 114. If however, the clock signal and data signals attempt to transition at substantially the same time, the separator circuit will delay one of the output signals. For example, if the data signal transitions from a low state to a high state, as explained above, transistors 142 and 144 are partially activated at the same time. The first current path, therefore, is provided through transistors 140, 142, and 144. The voltage level on intermediate node 141 is pulled down through transistors 142 and 144. If a clock signal transition is received while transistors 142 and 144 are both activated, the second current path through transistors 140, 146, and 148 competes with the first current path. Because the voltage on node 141 has been reduced, transistors 146 and 148 are slow to activate in response to the clock signal input. As such, the output signal on connection 116 is slightly delayed such that a time separation between transitions of the output data signal and output clock signal has been increased from the time separation between the input data signal and input clock signal. The separator circuit can be described as having a first current path controlled by a transition in the data input signal, and a second current path controlled by a transition in the clock input signal. The first and second current paths are coupled to receive a current supplied by a current source circuit such that when the first current path is conducting a current, the second current path is substantially prohibited from conducting current, and when the second current path is conducting current, the first current path is substantially prohibited from conducting current.

The output signals are processed through inverter circuit 170 or 180 and coupled to flip-flop circuit 200. Thus, the increased time separation allows flip-flop circuit 200 to accurately latch data provided from inverter circuit 180. It will be appreciated that if the clock signal transition is received on node 106 prior to a transition in the data signal provided at node 104, the second current path will be established first and the output data signal will be delayed slightly.

Figure 4:
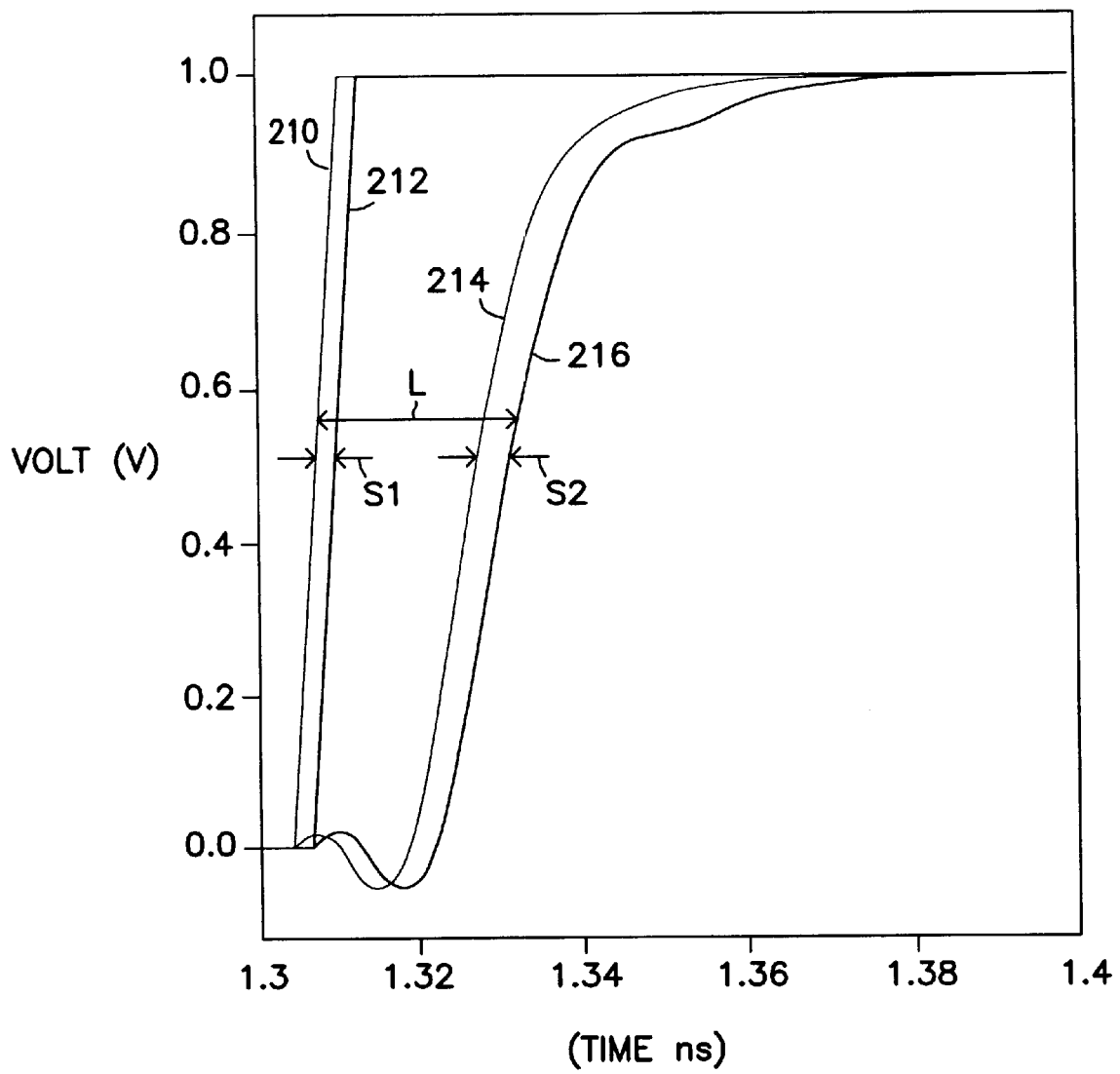
FIG. 4 illustrates a timing diagram of the circuit of FIG. 3.

Referring to FIG. 4, the timing diagram is provided to illustrate the operation of the circuit of FIG. 3. As illustrated, the input data signal (node 104) transitions from a low state to a high state and at substantially the same time as the clock signal (node 106) transitions from a low state to a high state. While the signal transitions are not simultaneous, the signals are separated by a time differential of approximately two picoseconds or (S 1). FIG. 4 also illustrates the output signals provided by inverter 170 and inverter 180. These signals are delayed from the input signals provided to the separator circuit by approximately 20 picoseconds or (L). More important, however, a time separation between the data signal in the clock signal has been increased to approximately four picoseconds or (S2). As such, a time separation between signal transitions has been increased by approximately two picoseconds.

Figure 5:
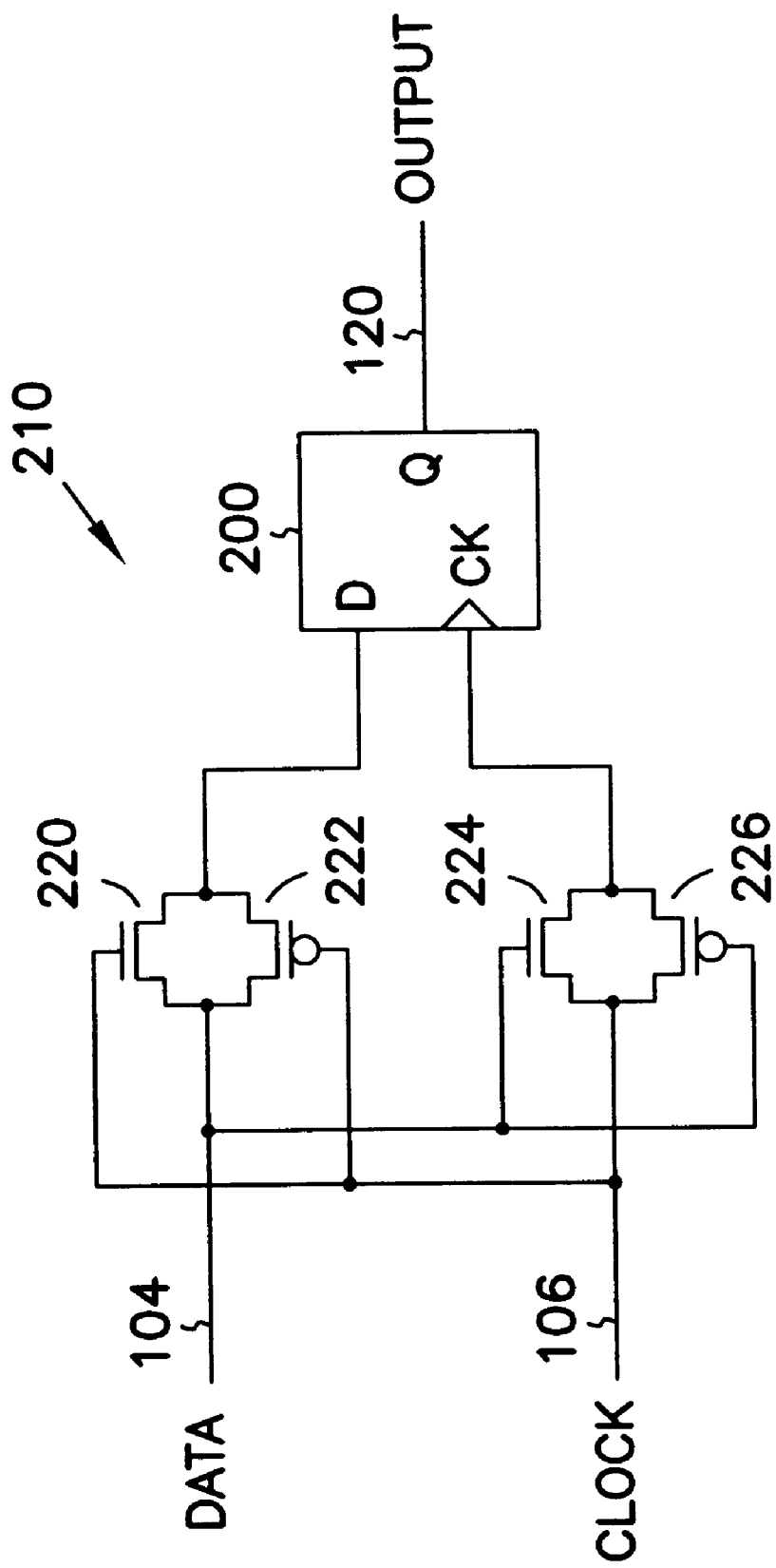
FIG. 5 is a schematic diagram of another embodiment of the present invention.
Figure 6:
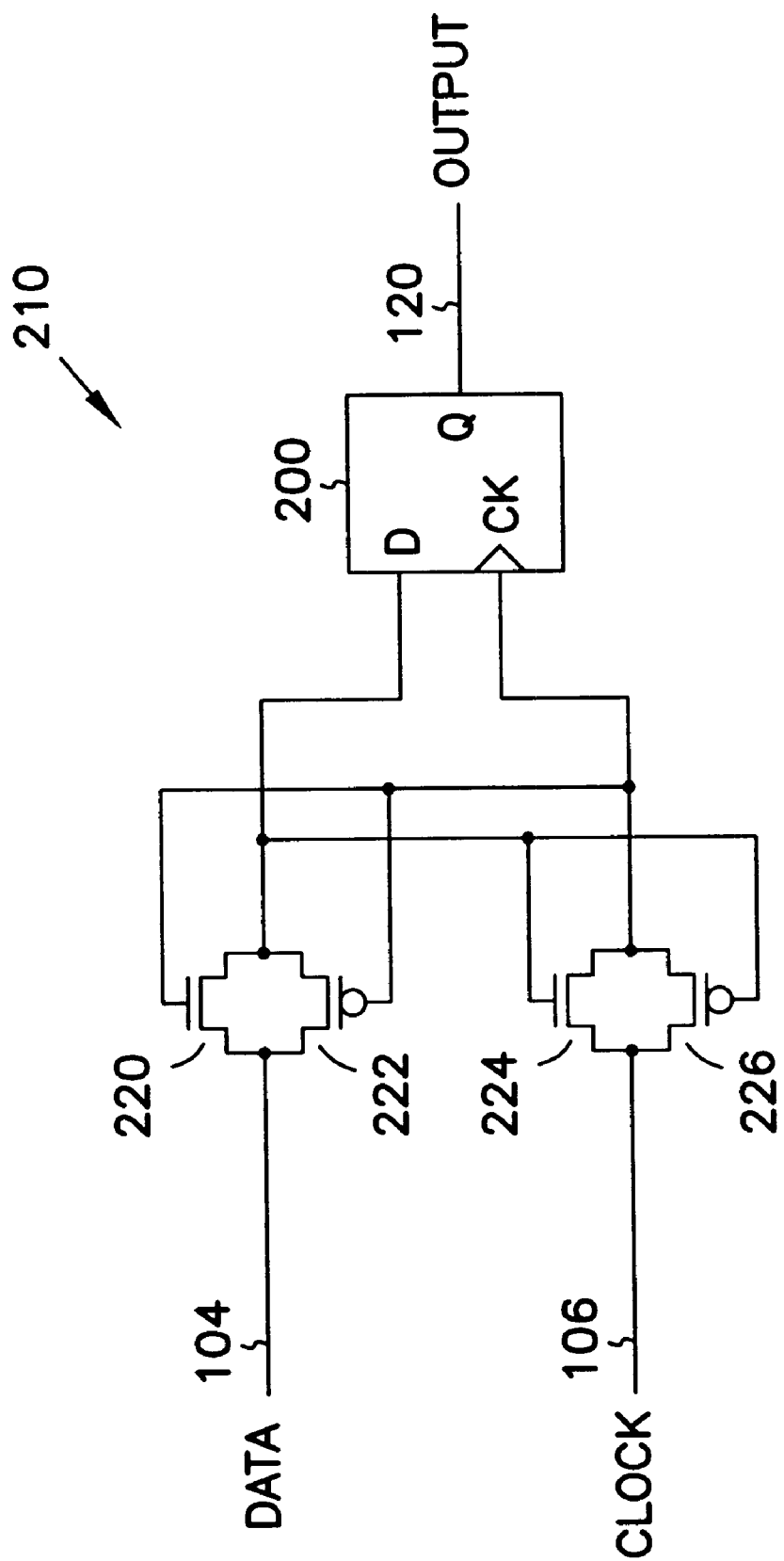
FIG. 6 is a schematic diagram of another embodiment of the present invention.

Referring to FIG. 5, a schematic diagram illustrates another embodiment of a CMOS clock and data separator circuit 210 of the present invention. The circuit includes a data input connection 104 and a clock signal connection 106. The stability circuit is coupled to a flip-flop circuit 200. Coupled between data connection 104 and the flip-flop circuit are two parallel pass transistors 220 and 222. Likewise, coupled between clock connection 106 and the flip-flop circuit are two pass transistors 224 and 226. The gates of the pass transistors are coupled to the opposite input connection such that the clock signal controls the data signal path, and the data signal controls the clock signal path. During a clock signal transition, the path through pass transistors 220 and 222 from node 104 to pin "D" of flip-flop 200 is essentially the most conductive when the clock signal is either low or high. In contrast, when the clock signal is transitioning, the same path is momentarily less conductive. As a result, the data signal is delayed before reaching pin "D" of flip-flop 200. In the same manner, a transition in the data signal essentially provides a less conductive path through transistors 224 and 226, hence resulting in a delayed clock signal received at pin "CLK" of flip-flop 200. An alternate embodiment is illustrated in FIG. 6. In this embodiment the pass transistors are controlled by the signal provided to the flip-flop circuit. This circuit operates in a manner similar to the circuit of FIG. 5, described above. Additional circuitry may be needed in both embodiments to encompass technical variations in future and past generations of transistors.

The embodiment illustrated in FIG. 3 uses series coupled CMOS transistors as pass gates. That is, transistors 142 and 144 operate as a pass gate circuit for the data signal arriving at node 104, and transistors 146 and 148 operate as pass gate circuit for the clock signal arriving at node 106. The embodiments illustrated in FIGS. 5 and 6 have pass gate circuits which have parallel coupled CMOS transistors. All of the embodiments, therefore, have pass gate circuits which comprise CMOS transistors that are selectively controlled to delay a second input signal that is received shortly after a first input signal is received.

Conclusion

A clock and data separator circuit and method have been described which allows for more efficient utilization of space on integrated circuits. The signal separator circuits described herein use CMOS transistors to provide an increase in separation times between transitions in the data signals and transitions in clock signals. The processing circuitry has been described as comprising pass gates that are selectively controlled to delay the latter of the input signals received at substantially the same time. In one embodiment the processing circuitry, or separator circuit, comprises a signal separator circuit that has two controllable current paths. In such an embodiment, whichever signal arrives first in time will delay the transition of the second arriving signal. In another embodiment, the processing circuitry comprises pass transistors that control a propagation path of a first input signal. The pass transistors are controlled by a second input signal. Likewise, whichever signal arrives first in time will delay the transition of the second arriving signal.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention is limited only by the claims and the equivalents thereof.

What is claimed is:

1. An integrated circuit comprising:
   a signal separator circuit capable of receiving a clock input signal having a clock transition and a data input signal having a data transition, wherein the signal separator analyzes the synchronization of the data transition with the clock transition and increases any delay between the clock transition and the data transition, provided that the clock transition is substantially synchronized with the data transition;
   pass gate circuitry such that the signal separator circuit implements the delay wherein a first arriving signal delays a second arriving signal's transition; and
   latch circuitry capable of capturing the delayed clock and data signals provided by the signal separator circuit.

2. The integrated circuit of claim 1 wherein the pass gate circuitry comprises:
   first series coupled transistors having gate connections coupled to a data input node, and an intermediate node coupled to a data output node;
   second series coupled transistors having gate connections coupled to a clock input node, and an intermediate node coupled to a clock output node; and
   a current source coupled to the first and second series coupled transistors.

3. The signal processing circuit of claim 2 wherein the first series coupled transistors comprise an N-channel pull down transistor coupled in series with a P-channel pull up transistor.

4. The signal processing circuit of claim 2 wherein the second series coupled transistors comprise an N-channel pull down transistor coupled in series with a P-channel pull up transistor.

5. The signal processing circuit of claim 2 wherein the current source comprises:
   a P-channel transistor coupled in series with the first and second series coupled transistors; and
   a voltage bias circuit coupled to a gate connection of the P-channel transistor.

6. The signal processing circuit of claim 1 wherein the latch circuit is a flip-flop circuit.

7. The signal processing circuit of claim 6 further comprising first and second inverter circuits respectively coupled between the clock output node and the data output node and the flip-flop circuit.

8. The signal processing circuit of claim 1 further comprising a clock circuit for providing the input clock signal.

9. The signal processing circuit of claim 1 wherein the pass gate comprises:
   first parallel connected transistors coupled between the data input node and the data output node, gate connections of the first parallel connected transistors are coupled to the clock input node; and
   second parallel connected transistors coupled between the clock input node and the clock output node, gate connections of the second parallel connected transistors are coupled to the data input node.

10. The signal processing circuit of claim 1 wherein the pass gate comprises:
    first parallel connected transistors coupled between the data input node and the data output node, gate connections of the first parallel connected transistors are coupled to the clock output node; and
    second parallel connected transistors coupled between the clock input node and the clock output node, gate connections of the second parallel connected transistors are coupled to the data output node.

11. A signal processing circuit comprising:
    a data input node to receive a data input signal;
    a clock input signal node to receive a clock input signal;
    a signal separator circuit coupled to the data input node and the clock input node, the signal separator circuit comprises,
      first P-channel transistor coupled in series with a first N-channel transistor, gate connections of the first P-channel transistor and the first N-channel transistor are coupled to the data input node,
      a second P-channel transistor coupled in series with a second N-channel transistor, gate connections of the second P-channel transistor and the second N-channel transistor are coupled to the clock input node, and
      a third P-channel transistor coupled to the first and second P-channel transistors;
    a flip-flop circuit;
    a first inverter circuit coupled between a data output node of the signal separator circuit and the flip-flop circuit; and
    a second inverter circuit coupled between a clock output node of the signal separator circuit and the flip-flop circuit.

12. The signal processing circuit of claim 11 further comprising a voltage bias circuit coupled to a gate connection of the third P-channel transistor.

13. A signal processing circuit comprising:
    a data input node to receive a data input signal;
    a clock input node to receive a clock input signal;
    a signal separator circuit comprising a first current path controlled by a transition in the data input signal, and a second current path controlled by a transition in the clock input signal, the first and second current paths are coupled to receive a current supplied by a current source circuit such that when the first current path is conducting a current, the second current path is substantially prohibited from conducting current, and symmetrically when the second current path is conducting current, the first current path is substantially prohibited from conducting current;
    latch circuitry coupled to the signal separator circuit for receiving an output data signal and an output clock signal provided by the signal separator circuit.

14. The signal processing circuit of claim 13 wherein the first current path comprises:
    an N-channel transistor coupled between a ground node and a data output node of the signal separator circuit, a gate node of the N-channel transistor is coupled to the data input node; and
    a P-channel transistor coupled between the data output node and the current source circuit, a gate node of the P-channel transistor is coupled to the data input node.

15. The signal processing circuit of claim 13 wherein the second current path comprises:
    an N-channel transistor coupled between a ground node and a clock output node of the signal separator circuit, a gate node of the N-channel transistor is coupled to the clock input node; and
    a P-channel transistor coupled between the clock output node and the current source circuit, a gate node of the P-channel transistor is coupled to the clock input node.

16. A method to process first and second signals comprising:
    receiving the first signal having a transition from its first state to its second state;
    receiving the second signal having a transition from its first state to its second state, the second signal transition is received at substantially the same time as the first signal transition such that a first time separation between the transitions is X;
    activating a first current path in a signal separator in response to the first signal transition;
    prohibiting activation of a second current path in the signal separator while the first current path is activated;
    symmetrically activating the second current path in response to the second transition;
    prohibiting activation of the first current path in the signal separator while the second current path is activated; and
    providing first and second output signals having a second time separation between transitions of the output signals that is greater than X.

17. The method of claim 16 wherein the first current path is through first series coupled transistors coupled to a current source, and the second current path is through second series coupled transistors coupled to the current source, the first and second output signals are provided by intermediate nodes of the first and second series coupled transistors, respectively.

18. The method of claim 16 wherein the first signal is a clock signal and the second signal is a data signal.

19. A method comprising:

receiving a clock input signal having a clock edge and a data input signal having a data edge at a signal separator;

analyzing the synchronization of the data edge with the clock edge; and increasing a delay between the clock edge and the data edge, by implementing CMOS pass gate circuitry to process a first arriving signal to delay an edge of a second arriving signal, provided that the clock edge is substantially synchronized with the data edge.

20. The method of claim 19, wherein increasing the delay comprises:

controlling the pass gate circuitry to process signal propagation of the data input signal and the clock input signal so that there is a substantial time separation between the clock edge and the data edge; and ignoring the signal propagation of the data input signal and the clock input signal when the clock edge and data edge are originally and substantially apart in time separation.

21. A signal processing circuit comprising:

a data input node to receive a data input signal;

a clock input signal node to receive a clock input signal;

a signal separator circuit coupled to the data input node and the clock input node such that transitions in the data input signal and transitions in the clock input signal have a first time differential, the signal separator circuit comprises a data output node and a clock output node, and pass gate transistors that can be selectively activated to provide an output data signal on the data output node and an output clock signal on the clock output node wherein transitions in the output data signal and transitions in the output clock signal have a second time differential that is greater than the first time differential; and a latch circuit coupled to the signal separator circuit for receiving the output clock signal and the output data signal.

22. A signal processing system comprising:

a first integrated circuit, wherein the first integrated circuit provides clock and system data;

a second integrated circuit capable of receiving the clock and system data from the first integrated circuit and providing an increased signal separation between the clock and system data;

a latch circuit comprising:
 a data input node;
 a clock input node;
 a data output node wherein the system data is latched.

* * * * *